United States Patent [19]

Chiang

[11] 3,841,904

[45] Oct. 15, 1974

[54] METHOD OF MAKING A METAL SILICIDE-SILICON SCHOTTKY BARRIER

[75] Inventor: Yuen-Shenk Chiang, Trenton, N.J.

[73] Assignee: RCA Corporation, New York, N.Y.

[22] Filed: Dec. 11, 1972

[21] Appl. No.: 314,002

[52] U.S. Cl. ............... 117/200, 117/47 R, 117/113, 117/118, 117/212, 117/213, 317/235 UA, 156/17

[51] Int. Cl. ............................ H01c 7/00, B44d 1/20

[58] Field of Search ........... 117/200, 213, 118, 217, 117/212, 113, 47 R; 317/235 UA; 156/17

[56] References Cited

UNITED STATES PATENTS

| | | | |
|---|---|---|---|
| 3,476,984 | 11/1969 | Tibol | 117/212 |
| 3,519,479 | 7/1970 | Inoue | 117/200 |
| 3,642,526 | 2/1972 | Itoh | 117/200 |
| 3,669,730 | 6/1972 | Lepselter | 117/200 |
| 3,742,317 | 6/1973 | Shao | 317/235 R |
| 3,752,702 | 8/1973 | Iizuka | 317/235 UA |

*Primary Examiner*—Leon D. Rosdol
*Assistant Examiner*—Michael F. Esposito
*Attorney, Agent, or Firm*—Arthur I. Spechler

[57] ABSTRACT

An iridium, platinum, or osmium silicide-silicon Schottky barrier is made by a novel method carried out at room temperature. First, an HF solution is applied to a cleaned surface of n-type silicon to remove any oxides thereon, and then a solution of HCl and a metal salt of iridium, platinum, or osmium is added to the HF solution to react with the silicon to form the metal silicide. An iridium silicide-silicon Schottky barrier has a barrier height of 0.93 ± 0.03 electron volt, one of the highest barrier heights reported to date.

5 Claims, 2 Drawing Figures

METHOD OF MAKING A METAL SILICIDE-SILICON SCHOTTKY BARRIER

BACKGROUND OF THE INVENTION

The present invention relates to a method of making a metal silicide-silicon Schottky barrier, and more particularly, to a method of producing either an iridium silicide, platinum silicide, or osmium silicide layer on a surface of a body of silicon. The novel method is particularly useful for producing Schottky barrier diodes and other semiconductor devices requiring a rectifying junction.

A Schottky barrier diode is a semiconductor device having a metal, or metal silicide, layer to semiconductor material surface barrier rectifying junction. Such diodes generally comprise a metal film coated directly on a surface of a body of a semiconductor material. A characteristic of a Schottky barrier diode that affects certain operating properties of the diode, such as the leakage current under reverse bias and the turn-on voltage, is the Schottky barrier height. The Schottky barrier height is the distance, in electron volts, between the Fermi level and the conduction band in the semiconductor material at the metal to semiconductor surface barrier junction. The greater the Schottky barrier height, the lower is the reverse-biased leakage current, and the higher is the turn-on voltage.

It has been proposed to produce Schottky barrier diodes by sputtering a metal layer onto a surface of silicon material or by depositing the metal by evaporation in an evacuated ambient, for example, both methods requiring expensive equipment and necessitating subsequent annealing at high temperatures. Where the Schottky barrier to be formed is a part of a semiconductor device having highly doped and/or temperature-sensitive portions, the high annealing temperatures employed in the prior-art methods tend to adversely affect the characteristics and/or the life of the device.

It has also been proposed to deposit metals on silicon in aqueous solutions but the resulting metal to silicon Schottky barrier formed is inferior to a metal silicide to silicon Schottky barrier in that the barrier height of the former is usually lower than that of the latter. Also, the metal silicide to silicon junction is much less susceptible to destruction by subsequent processing operations than the metal to silicon junction in that the former is less liable to separate, for example, than the latter.

SUMMARY OF THE INVENTION

The novel method of producing a metal silicide layer on a surface of a body of silicon comprises applying an HF solution to a cleaned surface of a body of silicon to remove any oxides thereon, and then adding thereto a solution of a hydrogen halide, preferably HCl, and a salt of iridium, platinum, or osmium to react with the silicon, whereby to form the metal silicide layer.

The novel method can be carried out at room temperature, with relatively inexpensive apparatus, and provides Schottky barrier rectifying junctions whose barrier heights are among the highest recorded.

DESCRIPTION OF THE PREFERRED EMBODIMENTS

Figure 1:
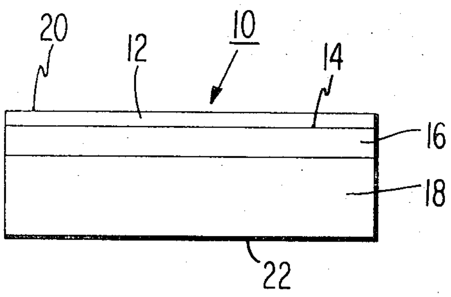
FIG. 1 is a side-elevational view of one example of a Schottky barrier diode made by the novel method.

Referring now to FIG. 1 of the drawing, there is shown one embodiment of a Schottky barrier diode 10. The diode 10 has a metal silicide layer 12, having a thickness of between 50 and 200A, on a surface 14 of a body 16 of n-type silicon, such as arsenic or phosphorus-doped silicon. The body 16 of n-type silicon is an epitaxial layer, having a thickness of between 1 and 5$\mu$m and a donor concentration of about $4 \times 10^{16}cm^{-3}$, deposited upon a (100) surface of a substrate 18 of degenerate (*n*++) silicon, for example. The substrate 18 may also be a p-type silicon. The surface 14 is a (100) surface, but it is within the contemplation of the novel method to use other surfaces, such as a (111) surface.

The substrate 18 has a thickness of about 10 mils and a resistivity of about 0.01 ohm-cm or less. The body 16 of silicon has a resistivity of about 0.2 ohm-cm. In practice, the upper surface 20 of the metal silicide layer 12 is metallized as with successive layers of chromium gold, and copper (not shown); and the lower surface 22 of the substrate 18 is also metallized, as with copper (not shown), for example, in a manner well known in the art.

Figure 2:
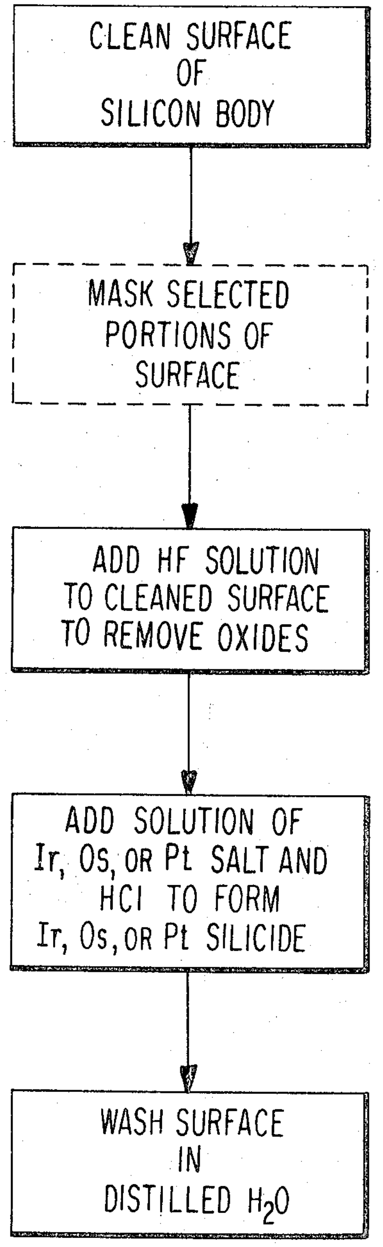
FIG. 2 is a flow diagram of the steps of one embodiment of the novel method.

The metal silicide layer 12 is a silicide of either iridium, platinum, or osmium produced by the novel method, as illustrated by the flow diagram shown in FIG. 2. The novel method comprises the steps of: (a) cleaning the surface 14 of the silicon body 16; (b) removing any oxides from the cleaned surface 14 with a concentrated HF solution; (c) adding, to the HF solution; a solution of an iridium, platinum, or osmium salt and a hydrogen halide, preferably HCl, to react with the silicon to form the metal silicide layer 12; and (d) removing the solutions from the metal silicide layer 12. Instead of treating the entire surface 14 of the body 16 of silicon, it is also within the contemplation of the novel method to treat only selected portions of the surface 14. Thus, some portions of the surface 14 may be suitably masked, as with a suitable photoresist by using photolithographic techniques, and only the unmasked portions of the surface 14 are treated.

In the novel method, the presence of a hydrogen halide in the HF and metal salt solution is important to insure the formation of a metal silicide layer rather than a pure metal deposit. The presence of a hydrogen halide also provides a smooth surface of the deposited metal silicide layer, thus providing a structure compatible with modern semiconductor technology. HCl in the aforementioned HF and metal salt solution is preferred to the hydrogen halides HBr and HI because of its ease of forming complexes with the metal salts.

The metal silicide layer 12, wherein the metal is either iridium, platinum, or osmium, is produced on the surface 14 of the silicon body 16 by the novel method as follows: First, the surface 14 is cleaned by any well-known cleaning technique for removing contaminants from the surface of a silicon body. One such technique includes successive immersions of the surface 14 in the following solutions: (a) $5H_2SO_4$: $1H_2O_2$: $1H_2O$, (b) HF, (c) 1HCl: $1H_2O_2$: $4H_2O$, (d) HF, (e) HF, and (f) ethyl alcohol. After each immersion, except the last, the surface 14 is washed with deionized water. After the last immersion, in ethyl alcohol, the surface 14 is spun dry.

Means are provided to remove any oxides from the cleaned surface 14 of the body 16. To this end, the surface 14 is immersed in about 10–30 ml HF (10–50%) (preferably 30 ml of 50% HF) contained in a "Teflon" or polyethylene container. After about 30 minutes, the surface 14 of the body 16 is ready to receive a metal silicide layer.

The metal silicide layer 12, wherein the metal is iridium, is produced by the novel method as follows: A solution, in the proportion of between 0.3 and 1.0 ml HCl and between 1 and 10 ml of 0.1% $IrCl_3.3H_2O$ (preferably 7 ml of 0.1% $IrCl_3.3H_2O$), is added to the aforementioned solution of 10–30 ml HF (50%) and allowed to remain in contact with the surface 14 to react with the silicon of the body 16, whereby to form the layer 12 of iridium silicide. Depending upon the concentration of the components of the aforementioned solutions, the iridium silicide layer 12 of suitable thickness (50–200A) is formed after between 10 and 100 hours at room temperature. The layer 12 is then rinsed with distilled water and spun dry. Other acid-soluble salts of iridium, such as $IrCl_4$, for example, can be used instead of the $IrCl_3.3H_2O$.

Electron diffraction measurements of the layer 12 formed on the surface 14 showed it to be iridium silicide. I-V (Current-Voltage) measurements of an iridium silicide-silicon Schottky barrier diode showed it to have excellent forward and reverse bias characteristics, with a knee of 0.4 to 0.5 volt in the forward direction and essentially no reverse-bias leakage current until reverse bias avalanche breakdown at a voltage where a p-n junction diode normally breaks down. For example, a reverse avalanche breakdown of 25 volts is observed for the iridium silicide Schottky diode with a 1.05$\mu$m thick n-type active body 16 at a donor concentration of $4 \times 10^{16}cm^{-3}$; and 14 volts for a 0.5$\mu$m thick n-type body 16 at a donor concentration of $6.5 \times 10^{16}cm^{-3}$.

C-V (Capacitance-Voltage) measurements lead to calculations showing that the barrier height of the layer 12 of iridium silicide on the n-type body 16 of silicon (donor concentration of $5 \times 10^{15} - 6.5 \times 10^{16}cm^{-3}$) is 0.93 ± 0.03 electron volt. Accurate leakage current measurements for both forward and reverse bias agree well with the theoretical values predicted for a barrier height of 0.9 volt. The Schottky barrier height produced by the novel method for the iridium silicide to silicon (n-type) Schottky barrier is among the highest reported for any Schottky barrier.

The metal silicide layer 12, wherein the metal is platinum, is produced by the novel method in a manner substantially similar to the production of the lyaer 12 of iridium silicide, the only difference being the substitution of a platinum salt for the iridium salt. Thus, the surface 14 of the body 16 of n-type silicon is cleaned, as previously stated, and immersed in between 10 and 30 ml HF (50%), as previously stated. After any of the oxides of silicon that may have formed on the surface 14 have been removed, a solution of between 0.3 and 1.0 ml of HCl and between 1 and 10 ml 0.1% $H_2PtCl_6.6H_2O$ (preferably 5 ml of 0.1% $H_2PtCl_6.6H_20$) is added to the aforementioned HF solution and left in contact with the surface 14 to react with the silicon of the body 16, whereby to form the layer 12 of platinum silicide. After between about 10 and 100 hours of being in contact with the aforementioned solutions, the layer 12 of platinum silicide, between 50 and 1,000A in thickness, is formed on the surface 14. Immersing the layer 12 of platinum silicide in aqua regia ($3HCl:1HNO_3$) for 24 hours does not alter the platinum silicide. The Schottky barrier height of the platinum silicide to silicon (n-type) rectifying junction is 0.854 electron volt. Other acid-soluble salts of platinum, such as $PtCl_2$, for example, may be substituted for the $H_2PtCl_6.6H_2O$.

The metal silicide layer 12, wherein the metal is osmium, is produced by the novel method as follows: The surface 14 of the body 16 of n-type silicon is treated in the same way as described for the formation of the layers of iridium silicide or platinum silicide with the exception that a metal salt of osmium is substituted for the metal salts of iridium or platinum. To produce the metal silicide layer 12 of osmium silicide, acid-soluble osmium salts, such as $OsCl_2$ and $OsCl_3$, can be used.

Metal silicides produced by the novel method on p-type silicon provide excellent ohmic contacts thereto.

The novel method of forming high barrier height Schottky barriers is particularly useful to provide Schottky diodes for rectification and switching circuits. The novel method can be used to replace the p-n junctions in a silicon vidicon tube with Schottky barrier rectifying junctions and to form avalanche IMPATT diodes and Schottky detector-mixers. The novel method can also be used to provide gate electrodes in the fabrication of enhancement mode, n-channel Schottky gate Field Effect Transistors and in integrated circuits.

I claim:

1. A method of producing a metal silicide layer on a surface of a body of silicon comprising the steps of:

applying a 10–50% HF solution to a cleaned surface of said body to remove any oxides thereon, adding, to said HF solution, a solution of 37% hydrogen chloride and a metal salt, the metal of said metal salt being selected from the group consisting of osmium, iridium, platinum, and mixtures thereof to react with said body of silicon at room temperature, said solutions being in the proportion of between 0.3–1.0 ml of said 37% hydrogen chloride solution and between 1.0 and 10 ml of said 0.1% metal salt solution to 10–30 ml of said HF solution, whereby to form said metal silicide layer on said surface, and removing said solutions from said layer.

2. A method of producing a metal silicide layer on a surface of a body of silicon, as described in claim 1, wherein:

the step of applying an HF solution to said cleaned surface comprises immersing said cleaned surface in 10 – 50% HF solution for between 10 minutes and 4 hours to remove any oxides of silicon from said surface.

3. A method of producing a metal silicide layer on a surface of a body of silicon, as described in claim 1, wherein:

the step of adding, to said HF solution, a solution of hydrogen chloride and a metal salt comprises immersing said surface in said solutions for between 10 and 100 hours.

4. A method of producing an iridium silicide layer on a surface of a body of n-type silicon comprising the steps of:

applying a 50% HF solution to a cleaned surface of said body for at least 30 minutes to remove any oxides of silicon thereon, adding to said HF (50%) solution in the proportion, a solution of 0.5 ml 37% HCl and 7 ml 0.1% $IrCl_3.3H_2O$ to 30 ml of said HF (50%) to react with said body of silicon at room temperature for between 10 and 100 hours, whereby to form said iridium silicide layer on said surface, and removing said solutions from said surface.

5. A method of producing a platinum silicide layer on a surface of a body of n-type silicon comprising the steps of:

cleaning said surface, applying a 50% solution to said cleaned surface for at least 30 minutes to remove any oxides of silicon thereon, adding to said HF (50%) solution, in the proportion, a solution of 0.5 ml 37% HCl, 5 ml 0.1% $H_2PtCl_6.6H_2O$ to 30 ml of said HF (50%) to react with said body of silicon at room temperature for between 10 and 100 hours, whereby to form said platinum silicide layer at said surface, and removing said solutions from said surface.

* * * * *